United States Patent
Hong et al.

(10) Patent No.: US 8,110,866 B2
(45) Date of Patent: Feb. 7, 2012

(54) NON-VOLATILE MEMORY DEVICE HAVING ASYMMETRIC SOURCE/DRAIN JUNCTION AND METHOD FOR FABRICATING THE SAME

(75) Inventors: Young Ok Hong, Icheon-si (KR); Myung Shik Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 228 days.

(21) Appl. No.: 12/132,386

(22) Filed: Jun. 3, 2008

(65) Prior Publication Data

US 2009/0096011 A1    Apr. 16, 2009

(30) Foreign Application Priority Data

Oct. 10, 2007    (KR) .................. 10-2007-0102298

(51) Int. Cl.
*H01L 29/72* (2006.01)

(52) U.S. Cl. ........ 257/324; 257/316; 257/321; 257/327; 257/288; 257/346; 257/362; 257/401

(58) Field of Classification Search .................. 257/288, 257/316, 321, 324, 327, 346, 362, 401
See application file for complete search history.

(56) References Cited

U.S. PATENT DOCUMENTS

| 2003/0143790 A1 | 7/2003 | Wu | 438/197 |
| 2006/0022259 A1* | 2/2006 | Kobayashi et al. | 257/321 |
| 2006/0071264 A1 | 4/2006 | Hemink et al. | 257/315 |
| 2008/0293207 A1* | 11/2008 | Koutny et al. | 438/306 |

FOREIGN PATENT DOCUMENTS

| JP | 2002-231832 | 8/2002 |
| KR | 10-1998-0012451 | 4/1998 |
| KR | 10-2005-0055364 | 6/2005 |

* cited by examiner

*Primary Examiner* — Edward Wojciechowicz
(74) *Attorney, Agent, or Firm* — Marshall, Gerstein & Borun LLP

(57) ABSTRACT

Disclosed herein are non-volatile memory devices with asymmetric source/drain junctions and a method for fabricating the same. According to the method, a gate stack is formed on a semiconductor substrate, and impurity ions are implanted at a predetermined angle to form a source/drain junction in the semiconductor substrate. Thermal treatment of the semiconductor substrate forms an asymmetrically disposed source/drain junction between adjacent gate stacks.

8 Claims, 5 Drawing Sheets

NON-VOLATILE MEMORY DEVICE HAVING ASYMMETRIC SOURCE/DRAIN JUNCTION AND METHOD FOR FABRICATING THE SAME

CROSS-REFERENCE TO RELATED APPLICATION

The priority of Korean patent application No. 10-2007-0102298 filed on Oct. 10, 2007, the disclosure of which is incorporated by reference in its entirety, is claimed.

BACKGROUND OF THE INVENTION

1. Field of the Disclosure

The present invention generally relates to a method for fabricating a semiconductor device, and more particularly, to a non-volatile memory device with asymmetric source/drain junctions and a method for fabricating the same.

2. Brief Description of Related Technology

Non-volatile memory devices are mainly used in electronic components that require data retention even when no power is supplied. A non-volatile memory device typically includes a floating gate structure in which a polysilicon film is capped with an inter-poly oxide (IPO). Because non-volatile memory devices are very highly integrated, new cell structures have replaced floating gates.

One of the new cell structures has a charge trapping layer, e.g., a silicon-oxide-nitride-oxide-silicon (SONOS) structure. SONOS devices have excellent reliability in interface or data retention because the nitride film is used as a charge trap site. A SONOS device is a stacked structure on a semiconductor substrate with a channel region, a tunneling layer, a charge trapping layer, a blocking layer, and a control gate electrode.

However, as the integration density of semiconductor devices is increased and design rule is drastically reduced, there are various difficulties in achieving reliable operations of a device. For example, as the width of a gate is reduced, the length of the channel is drastically decreased. Therefore, short channel effect may frequently occur, causing the reduction of the threshold voltage, the increase of leakage current, and the deterioration of the refresh characteristic. Short channel effect may cause punch-through between the source and drain of a transistor. Moreover, punch-through may cause device malfunction.

Because short channel effect frequently occurs in non-volatile memory devices, the reliability of the devices decreases. Short channel effect reduces the threshold voltage of a memory cell, thereby degrading the threshold voltage distribution.

SUMMARY OF THE INVENTION

Embodiments of the present invention are directed to non-volatile memory devices capable of improving threshold voltage changes by increasing effective channel length, and a method for fabricating the same.

In one embodiment, a non-volatile memory device includes: a plurality of gate stacks laterally spaced at a predetermined interval on a semiconductor substrate; and source/drain junctions asymmetrically disposed between the gate stacks in the semiconductor substrate. The source/drain junctions may be asymmetrically disposed approximately 20 nanometers (nm) to approximately 45 nm from edge of the gate stack.

The gate stack on the semiconductor substrate may include: a tunneling layer disposed on the semiconductor substrate; a charge trapping layer disposed on the tunneling layer; a blocking layer disposed on the charge trapping layer to block charge transfer; and a control gate disposed on the blocking layer.

In another embodiment, the gate stack may include: a tunneling layer disposed on the semiconductor substrate; a floating gate disposed on the tunneling layer; an interlayer insulating layer disposed on the floating gate; and a control gate disposed on the interlayer insulating layer.

In another embodiment, a method for fabricating a gate stack on a semiconductor layer includes: forming gate stacks on a semiconductor substrate; implanting impurity ions at a predetermined tilt angle; and thermally treating the semiconductor substrate to form a source/drain junction asymmetrically disposed between adjacent gate stacks.

A tilt angle of approximately 4° to approximately 7° may be used to implant the impurity ions on the semiconductor substrate. Further, energy of approximately 5 kiloelectron-volts (KeV) to approximately 50 KeV and a dose of approximately $1 \times 10^{13}$ atoms per square centimeter (atom/cm$^2$) to approximately $1 \times 10^{14}$ atom/cm$^2$ may be used. Thermal treatment may be performed between approximately 700° C. and approximately 1000° C.

In another embodiment, a method for fabricating a gate stack on a semiconductor substrate includes: forming a tunneling layer and a conductive layer on a semiconductor substrate; patterning the conductive layer and exposing the semiconductor substrate on the device isolation region to form the floating gate; etching the exposed area of the semiconductor substrate to form a trench; filling the trench with an insulating layer to form a device isolation layer; forming an interlayer insulating layer that surrounds the floating gate; and forming a control gate on the interlayer insulating layer.

BRIEF DESCRIPTION OF THE DRAWINGS

For a more complete understanding of the disclosure, reference should be made to the following detailed description and accompanying drawings.

While the disclosed device and method are susceptible of embodiments in various forms, specific embodiments are illustrated in the drawings (and will hereafter be described), with the understanding that the disclosure is intended to be illustrative, and is not intended to limit the invention to the specific embodiments described and illustrated herein.

DETAILED DESCRIPTION OF SPECIFIC EMBODIMENTS

Typically source/drain junctions are symmetrically disposed between the gate stacks. Therefore, the length of the channel is almost identical to the width of the gate. Accordingly, because memory devices are highly integrated, the width of the gates is reduced and the channel length decreases. Therefore, short channel effect occurs, which may cause malfunctions. Disclosed herein is a non-volatile memory device with asymmetric source/drain junctions and a method for fabricating the same. Asymmetric source/drain junctions allow for increased effective channel length resolving various limitations associated with short channel effect and increased integration.

Figure 1:
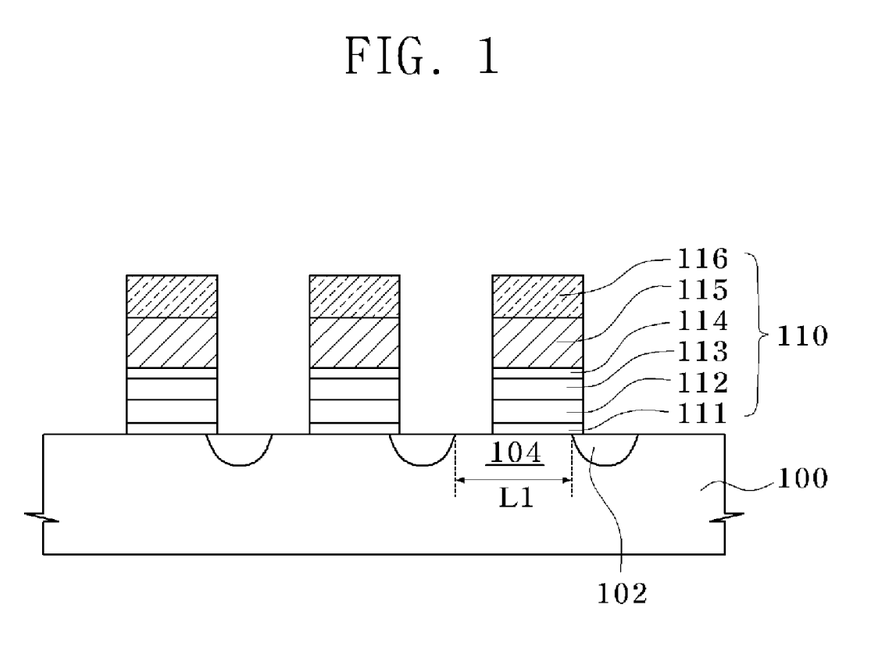
FIG. 1 illustrates a cross-sectional view of a non-volatile memory device with asymmetric junctions according to one embodiment of the present invention.

The non-volatile memory device with a charge trapping layer of FIG. 1 includes a plurality of gate stacks 110, source/drain junctions 102, and a channel region 104. The gate stacks 110 are disposed on a semiconductor substrate 100 and are laterally spaced at a predetermined interval. The source/drain junction 102 is disposed in the semiconductor substrate 100 between the gate stacks 110. The channel region 104 is disposed in the semiconductor substrate 100 between the source/drain junctions 102.

The semiconductor substrate 100 is usually a silicon substrate, but can also be a silicon on insulator (SOI) substrate or another kind of substrate.

The source/drain junction 102 is asymmetrically disposed between adjacent gate stacks as illustrated in FIG. 1. Therefore, the length L1 of the channel region 104 is increased. The asymmetric disposition of the source/drain junction 102 between the gate stacks 110 is adjustable. In a preferred embodiment, the source/drain junction 102 may be asymmetrically disposed approximately 20 nm to approximately 45 nm from edge of the gate stack.

The gate stack 110 on the semiconductor substrate 100 includes a tunneling layer 111, a charge trapping layer 112, a blocking layer 113, a barrier layer, a control gate electrode 115, and a low resistance layer 116.

The tunneling layer 111 allows charge carriers such as electrons or holes to tunnel into the charge trapping layer 112 and conventionally includes an insulating layer such as a silicon oxide ($SiO_2$) film. The tunneling layer 111 gradually deteriorates because of repeated tunneling by charge carriers, thereby degrading device stability. Accordingly, the tunneling layer 111 may have a certain thickness capable of preventing stability degradation.

The charge trapping layer 112 traps electrons or holes implanted through the tunneling layer 111. When the energy level is uniform and the number of trap sites increases, the program or erase speed of a device becomes faster because charge trap is easily formed. The charge trapping layer 112 may include single layer or a stacked layer of silicon nitride, for example, a stoichiometric silicon nitride ($Si_3N_4$) film, a silicon (Si)-rich silicon nitride ($Si_xN_y$) film, or a stacked structure of the stoichiometric silicon nitride ($Si_3N_4$) film and the silicon (Si)-rich silicon nitride ($Si_xN_y$) film.

The blocking layer 113 prevents charges from tunneling from the charge trapping layer 112 to the control gate electrode 115 above. To improve the operating speed of the memory cell, the blocking layer 113 may be formed of a high-k material including, for example, an aluminum oxide ($Al_2O_3$) film, a zirconium oxide ($ZrO_3$) film, a hafnium oxide ($HfO_2$) film, a lanthanum oxide ($La_2O_3$) film, a tantalum oxide ($Ta_2O_5$) film, a strontium titanium ($SrTiO_3$) film, or an oxide film of a perovskite structure.

A predetermined bias voltage applied to the control gate electrode 115 allows electrons or holes to tunnel from the channel region 104 of the semiconductor substrate 100 into the trap site of the charge trapping layer 112. The control gate electrode 115 may be a doped polysilicon film or a metal film.

A barrier layer 114 may be further disposed between the blocking layer 113 and the control gate electrode 115 to prevent electrons from tunneling from the control gate electrode 115 to the blocking layer 113 during an erase operation. During an erase operation, a high bias voltage is applied to the semiconductor substrate 100 and the control gate electrode 115 is grounded. However, without a barrier layer, an erase operation may not be performed because electrons transfer from the control gate electrode 115 to the semiconductor substrate 100. The barrier layer 114 can be formed of a metal with a high work function, such as titanium nitride (TiN), tungsten nitride (WN), tantalum nitride (TaN), and lanthanium nitride (LaN).

The low resistance layer 116 is disposed on the control gate electrode 115 in order to reduce resistance of the gate. However, the low resistance layer can be omitted. The low resistance layer 116 may be formed from a low resistance metal silicide.

Figure 2:
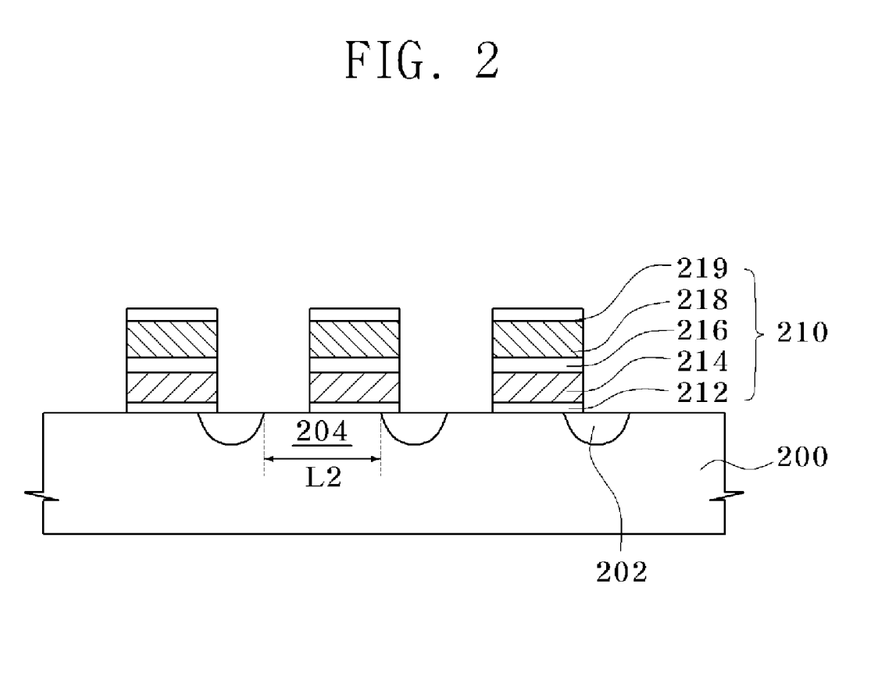
FIG. 2 illustrates a cross-sectional view of a non-volatile memory device with asymmetric junctions according to another embodiment of the present invention.

The non-volatile memory device of FIG. 2 is a floating gate non-volatile memory device. It includes a plurality of gate stacks 210, source/drain junctions 202, and channel region 204. The gate stacks 210 are disposed on the semiconductor substrate 200, and are laterally spaced at a predetermined interval. The source/drain junctions 202 are asymmetrically disposed between the gate stacks 210 in the semiconductor substrate 200. The channel region 204 is disposed in the semiconductor substrate 200 between the source/drain junctions 202.

The gate stacks 210 of FIG. 2 differ from those of FIG. 1. The gate stack 210 includes a tunneling layer 212, a floating gate 214, an interlayer insulating layer 216, and a control gate 218. The gate stack 210 may further include a low resistance layer 219.

The tunneling layer 212 allows charge carriers such as electrons or holes to tunnel into the floating gate. The tunneling layer 212 gradually deteriorates because of repeated tunneling by charge carriers, leading to the degradation of device stability. Accordingly, the tunneling layer 212 may be of a certain thickness to prevent stability degradation.

The tunneling layer 212 is typically formed of an insulating layer such as a silicon oxide ($SiO_2$) film. The floating gate 214 is typically formed of a doped polysilicon film. The interlayer insulating layer 216 may have an oxide-nitride-oxide (ONO) structure.

A predetermined bias voltage applied to the control gate 218 allows electrons or holes to tunnel from the channel region 204 of the semiconductor substrate 200 into the floating gate 214. The control gate electrode 218 may be formed of a doped polysilicon film or a metal film. A low resistance layer 219 is optionally deposited on the control gate 218 to reduce resistance of the gate. The low resistance layer 219 may be formed of a low resistance metal silicide.

The source/drain junction 202 is disposed in the semiconductor substrate 200 between the gate stacks 210. Like the embodiment in FIG. 1, the source/drain junction 202 is asymmetrically disposed between adjacent gate stacks. Therefore, the length L2 of the channel region 204 can be increased and operating characteristics of the device can be improved. The asymmetric disposition of the source/drain junction 202 between the gate stacks 210 can be adjusted. In a preferred embodiment, the source/drain junction 202 may be asymmetrically disposed approximately 20 nm to approximately 45 nm from edge of the gate stack.

FIGS. 3 to 6 illustrate a method for fabricating a non-volatile memory device with asymmetric junctions according to one embodiment of the present invention. The method includes forming a gate stack and implanting impurities at a predetermined tilt angle on a semiconductor substrate to form asymmetric source/drain junctions.

Figure 3:
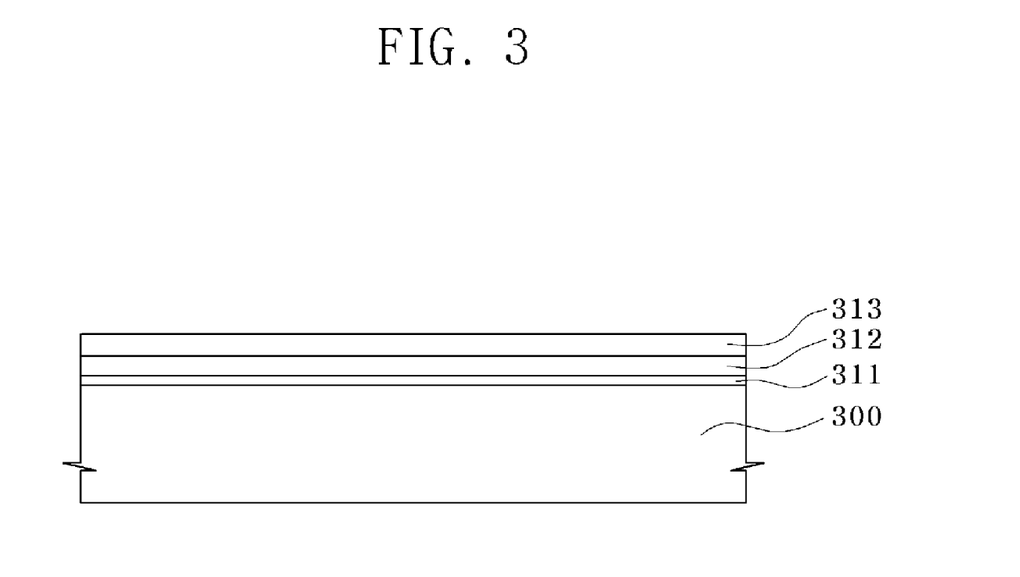
FIGS. 3 to 6 illustrate a method for fabricating a non-volatile memory device with asymmetric junctions according to one embodiment of the present invention.

Referring to FIG. 3, an insulating layer such as an oxide film is deposited in a predetermined thickness on the semiconductor substrate 300 to form the tunneling layer 311. Although not illustrated, a device isolation layer can be formed on the semiconductor substrate 300 to separate the active region from the inactive region using a conventional device isolating method.

A silicon nitride (SiN) film, for example, a stoichiometric silicon nitride ($Si_3N_4$) film, a silicon (Si)-rich silicon nitride ($Si_xN_y$) film, or a stacked structure of the stoichiometric silicon nitride ($Si_3N_4$) film and the silicon (Si)-rich silicon nitride ($Si_xN_y$) film can be deposited on the tunneling layer 311 to form a charge trapping layer 312. The charge trapping layer 312 may be formed using well-known methods such as chemical vapor deposition (CVD) or atomic layer deposition (ALD).

A dielectric film is deposited on the charge trapping layer 312 to form a blocking layer 313. The blocking layer 313 can be formed by depositing an oxide film with a CVD method. Moreover, to improve device characteristics, the blocking layer 313 may be a high-k material, such as an aluminum oxide ($Al_2O_3$) film, a zirconium oxide ($ZrO_3$) film, a lanthanium oxide ($La_2O_3$) film, a tantalum oxide ($Ta_2O_5$) film, a strontium titanium oxide ($SrTiO_3$) film, or an oxide film of a perovskite structure.

Figure 4:
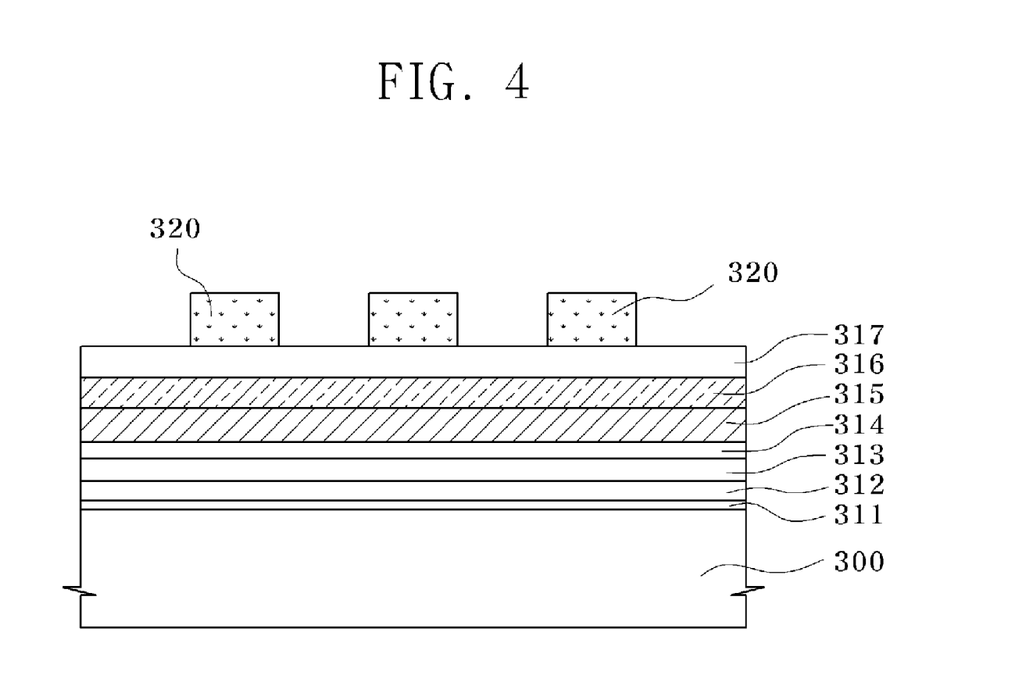

Referring to FIG. 4, a barrier metal is deposited on the blocking layer 313, thereby forming the barrier layer 314 to prevent charges from transferring from the control gate electrode 315 to the channel during an erase operation. However, the barrier layer 314 may be omitted if necessary. A control gate electrode 315 is deposited on the barrier layer 314, and a low resistance layer 316 is deposited on the control gate electrode 315. The control gate electrode 315 may be a polysilicon film doped with impurities. The low resistance layer 316 reduces resistance of a gate and may be a metal silicide such as tungsten silicide (WSi).

Next, a nitride film is deposited on the low resistance layer 316 to form a hard mask layer 317 that will be used as a mask in an etching process to form the gate stack. A photoresist pattern 320 is formed on the hard mask layer 317 to produce the gate stack using a photolithography process.

Figure 5:
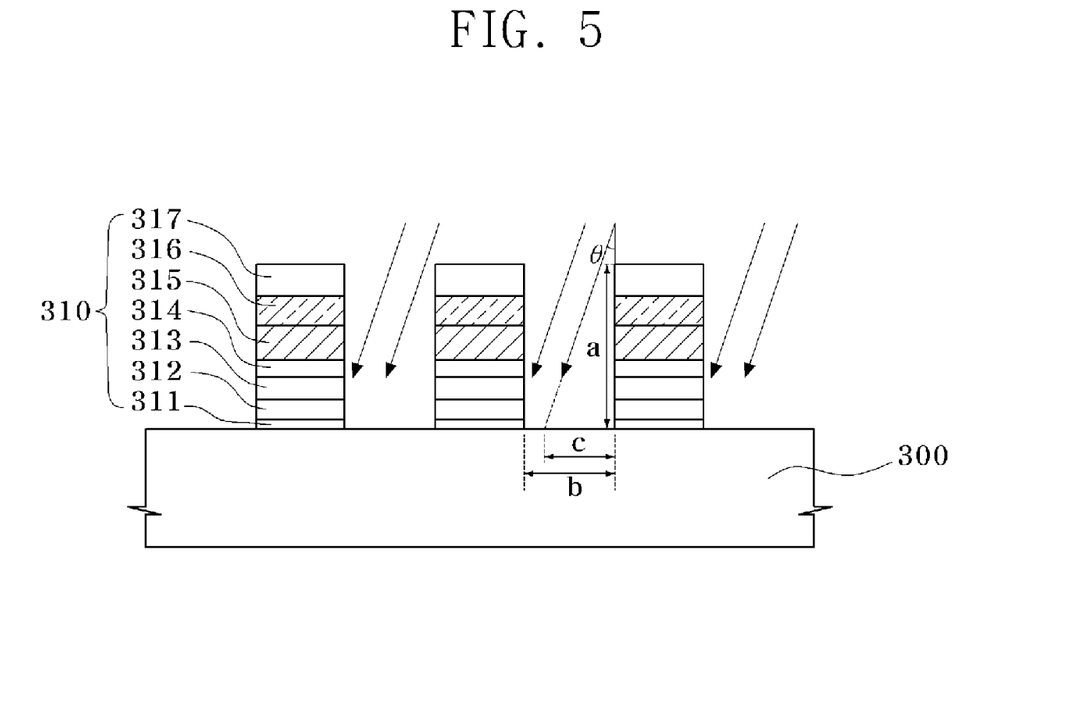

Referring to FIG. 5, using the photoresist pattern 320 as an etching mask, the gate stack 310 is formed by etching the hard mask layer 317, the low resistance layer 316, the control gate electrode 315, the barrier layer 314, the blocking layer 313, the charge trapping layer 312, and the tunneling layer 311. After the etching process, the photoresist pattern 320 is removed. On the other hand, the layers 311 to 316 below the hard mask layer 317 can be etched using the patterned hard mask layer 317 after removing the photoresist pattern 320.

To form a source/drain junction, an impurity is implanted on the semiconductor substrate 300. If the semiconductor substrate 300 is a p-type semiconductor substrate, the implanted impurity may be arsenic (As) or phosphorus (P). The impurity ions are implanted at a predetermined angle rather than perpendicular to the surface of the semiconductor substrate 300. Referring to the drawings, the height of the gate stack is designated as "a", the interval between gate stacks is designated as "b", an ion implantation angle, or tilt angle, is designated as "θ", and the length of a junction is designated as "c", the length of junction c is expressed in the following Equation 1:

$$c = b - a \times \tan \theta \quad \text{(Eq. 1)}$$

Accordingly, the tilt angle can be adjusted within a range wherein the length of junction c is identical to or less than interval b. For example, when the height a of the gate stack 310 is approximately 2500 Å, the length of junction c is approximately 38 nm with a tilt angle of approximately 5°. Accordingly, the channel length can be adjusted because the length of the source/drain junction can be adjusted by varying the ion implantation angle.

According to a preferred embodiment, a tilt angle of approximately 4° to approximately 7° is used. Moreover, the impurity ions may be arsenic (As) or phosphorus (P) implanted at approximately 5 KeV to approximately 50 KeV and a dose of approximately $1 \times 10^{13}$ atom/$cm^2$ to approximately $1 \times 10^{14}$ atom/$cm^2$.

Figure 6:
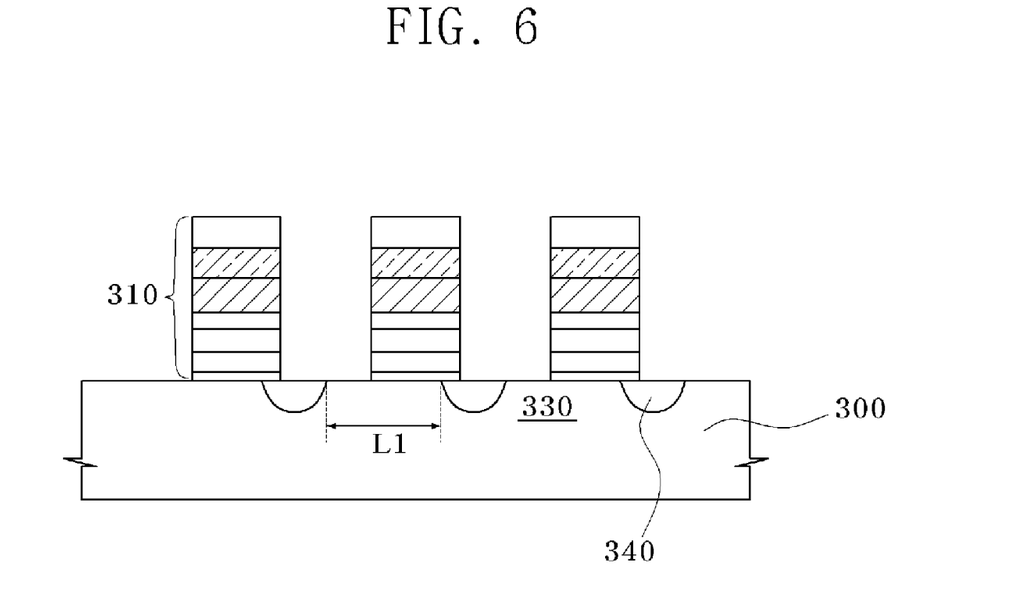

Referring to FIG. 6, thermal treatment of the semiconductor substrate 300 diffuses the impurity ions to form asymmetrically disposed source/drain junctions 340. The thermal treatment process is performed using a furnace or a rapid thermal process (RTP) between approximately 700° C. and approximately 1000° C. for ion activation and a decrease in lattice coupling.

To operate a non-volatile memory device with an asymmetric source/drain junction, a predetermined bias voltage is applied to the control gate electrode 315 forming an electric field between the control gate electrode 315 and the source/drain junction 340. The electric field forms an inversion layer below the surface of the semiconductor substrate 300 between the source/drain junctions 340, which forms a channel 330. The length L1 of the effective channel 330 is increased compared to prior technology because the source/drain junctions are asymmetrically disposed relative to the gate stacks 320.

FIGS. 7 to 10 illustrate a method for fabricating a non-volatile memory device with asymmetric junctions according to another embodiment.

Figure 7:
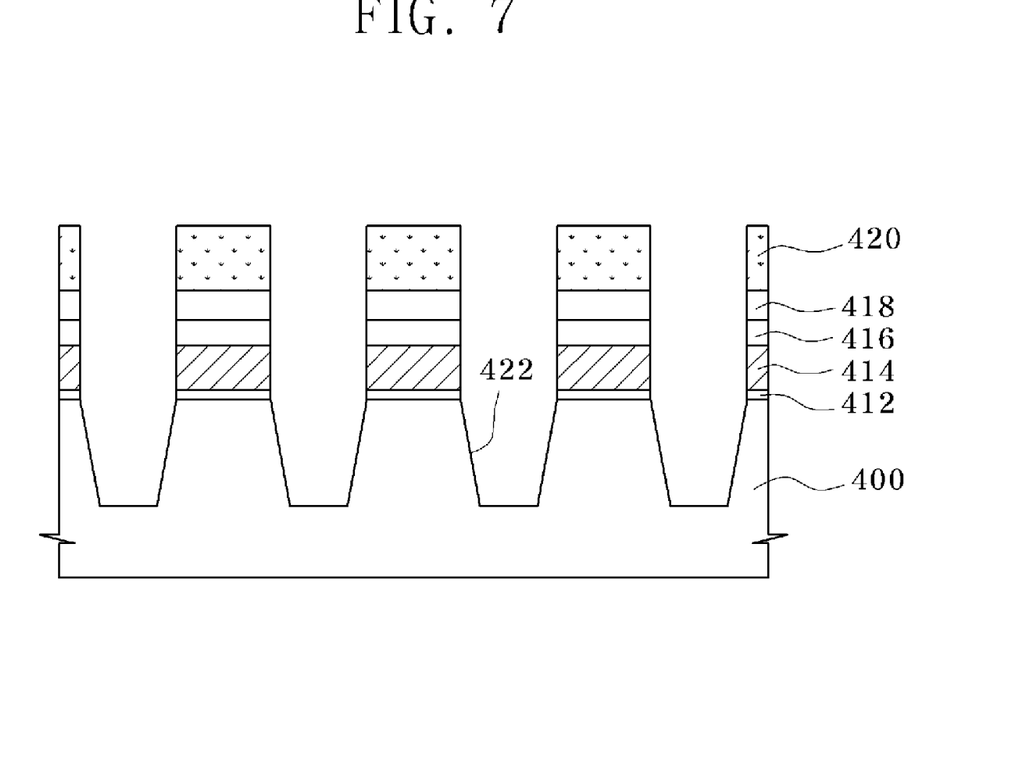
FIGS. 7 to 10 illustrate a method for fabricating a non-volatile memory device with asymmetric junctions according to another embodiment of the present invention.
Figure 8:
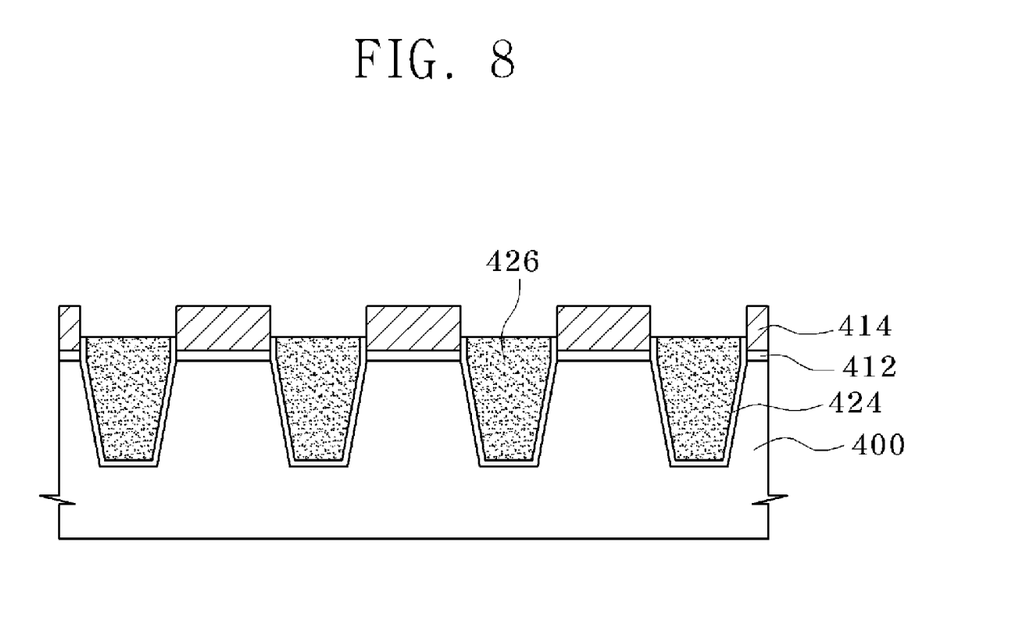
Figure 9:
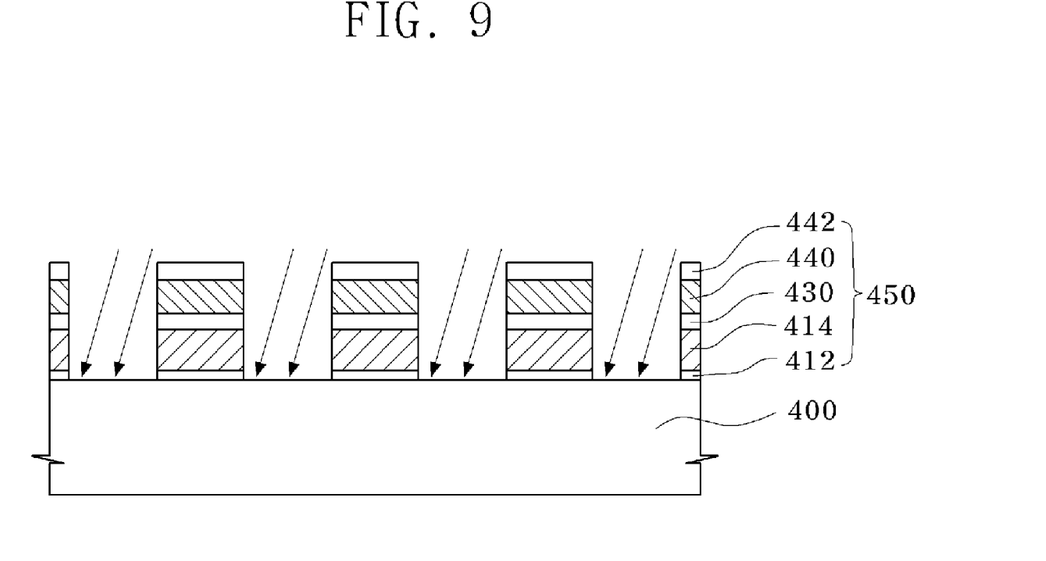
Figure 10:
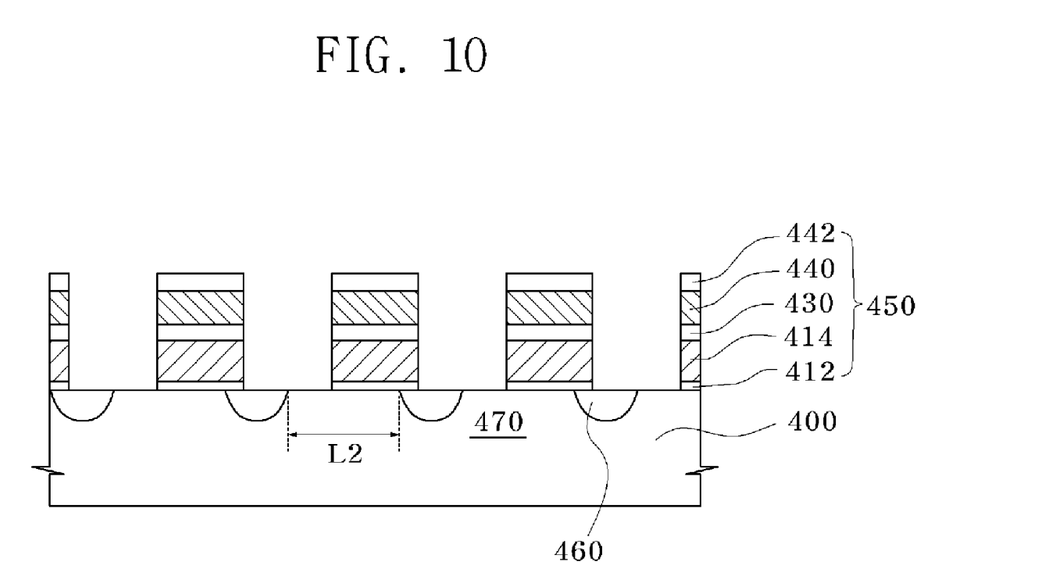

FIGS. 7 and 8 illustrate cross-sectional views of the device isolation region, and FIGS. 9 and 10 are cross-sectional views of the active region. Accordingly, the device isolation layer is not shown in FIGS. 9 and 10. Additionally, according to this embodiment, processes for forming a device isolation layer using self aligned-shallow trench isolation (SA-STI) are illustrated, but it is apparent that other methods may be used to form the device isolation layer.

Referring to FIG. 7, a tunneling layer 412 is formed on a semiconductor substrate 400 by depositing an oxide film, and a polysilicon film 414 is deposited to form a floating gate on the tunneling layer 412. Thereafter, an etching stop layer 416 is formed by depositing a nitride film on the polysilicon film. The etching stop layer 416 protects the layers below during the CMP process. An oxide film is deposited on the etching stop layer 416 at a predetermined thickness, such that a hard mask layer 418 is formed to protect the layers below during a gate patterning process. A photoresist pattern 420 is formed on the hard mask layer 418 to define the device isolation region.

Using the photoresist pattern 420 as an etching mask, the semiconductor substrate 400 is exposed by performing an anisotropic etching process on the hard mask layer 418, the etching stop layer 416, the polysilicon film 414 for a floating gate, and the tunneling layer 412. Thereafter, further anisotropic etching to a predetermined depth exposes trench 422 in the device isolation region in the exposed semiconductor substrate.

Referring to FIG. 8, an inner wall oxide film 424 is formed on the inner wall of the trench 422. The inner wall oxide film 424 compensates for damage to the semiconductor substrate 400 from the anisotropic etching process for trench formation. The inner wall oxide film 424 can be formed, for example, by depositing boron phosphorus silicate glass (BPSG), spin on glass (SOG), or phosphorus silicate glass (PSG).

After the trench 422 is filled with an insulating material and planarized, a device isolation layer 426 is formed. For example, a high density plasma (HDP) oxide film is deposited on the entire surface of the semiconductor substrate 400 with the inner wall oxide film 424. PSG is applied on the HDP oxide film in a predetermined thickness, and is planarized using a CMP process. Thereafter, HDP oxide film is deposited again to completely fill the trench forming the device isolation layer 426. Various other methods of fabricating a device isolation layer may be employed.

Another CMP process planarizes the device isolation layer 426 using the etching stop layer 416 of FIG. 7 as an end point. The height from the semiconductor substrate 400 to the device isolation layer 426 is the effective field oxide height (EFH). The hard mask layer 418 of FIG. 7 is removed during the CMP process. After removing the etching stop layer 416, an upper portion of the device isolation layer 426 is etched for a predetermined amount to create a recess and to adjust the EFH.

Referring to FIG. 9, an interlayer insulating layer 430 of an oxide-nitride-oxide (ONO) structure is formed by sequentially stacking an oxide film, a nitride film, and an oxide film on the semiconductor substrate 400 with the device isolation layer 426. On the interlayer insulating layer 430 is the control gate 440. An optional layer, the low resistance layer 442, may be deposited on the control gate 440. For example, after sequentially stacking a polysilicon film doped with impurity and tungsten silicide (WSi) on the interlayer insulating layer 430, the low resistance layer 442 and the control gate 440 are formed by patterning the tungsten silicide (WSi) film, the polysilicon film, and the interlayer insulating layer 430.

Impurity ions are implanted on the semiconductor substrate 400 to form source/drain junctions. The impurity ions are diagonally implanted on the semiconductor substrate 400 at a predetermined angle. According to one embodiment, a tilt angle of approximately 4° to approximately 7° is used to implant impurity ions. If the semiconductor substrate 400 is a p-type semiconductor substrate, the impurities ions may be As or P implanted at approximately 5 KeV to approximately 50 KeV and a dose of approximately $1\times10^{13}$ atom/cm$^2$ to approximately $1\times10^{14}$ atom/cm$^2$.

Referring to FIG. 10, thermal treatment of the semiconductor substrate 400 with implanted impurity ions at approximately 700° C. to approximately 1000° C. causes the implanted impurity ions to disperse, forming the asymmetrically disposed source/drain junction 460.

When a predetermined bias voltage is applied to the control gate electrode 440 during an erase operation, an electric field occurs between the control gate electrode 440 and the source/drain junction 460. Further, an inversion layer is formed below the surface of the semiconductor substrate 400 between the source/drain junctions 420 forming channel 470. Because the source/drain junction 460 is asymmetrically disposed, the length L2 of the effective channel 470 is increased. Accordingly, various limitations due to short channel effect can be resolved.

The specific embodiments of the present invention have been described for illustrative purposes. Those skilled in the art will appreciate that various modifications, additions and substitutions are possible, without departing from the spirit and scope of the invention as recited in the following claims.

What is claimed is:

1. A non-volatile memory device comprising:

a plurality of gate stacks disposed on a semiconductor substrate and laterally spaced at a predetermined interval, wherein a portion of the semiconductor substrate is disposed in a space between adjacent ones of the plurality of gate stacks and no gate stack structures are disposed on the portion of the semiconductor device, wherein each gate stack comprises a tunneling layer disposed on the semiconductor substrate, a charge trapping layer disposed on the tunneling layer, a blocking layer disposed on the charge trapping layer, and a control gate disposed on the blocking layer;

source/drain junctions disposed in the semiconductor substrate between adjacent ones of the plurality of gate stacks, wherein the source/drain junctions each comprising a first edge portion that overlaps an edge of the one of the plurality of gate stacks and a second edge portion on a side opposite the first edge portion, wherein the second edge portion does not overlap the one of the plurality of gate stacks or an adjacent one of the plurality of gate stacks to be apart from the opposite edge of the gate stacks and the second edge portion overlaps the portion of the semiconductor substrate in which no gate stack structures are disposed; and a channel formed between the source/drain junctions.

2. The non-volatile memory device of claim 1, wherein the source/drain junctions are disposed approximately 20 nm to approximately 45 nm from the edge of the one of the plurality of gate stacks.

3. The non-volatile memory device of claim 1, wherein the charge trapping layer comprises a single layer or a stacked layer.

4. The non-volatile memory device of claim 1, further comprising a barrier layer disposed between the blocking layer and the control gate.

5. A non-volatile memory device comprising:

a plurality of gate stacks disposed on a semiconductor substrate and laterally spaced at a predetermined interval, wherein a portion of the semiconductor substrate is disposed in a space between adjacent ones of the plurality of gate stacks and no gate stack structures are disposed on the portion of the semiconductor device, wherein each gate stack comprises:

a tunneling layer disposed on the semiconductor substrate;

a floating gate disposed on the tunneling layer;

an interlayer insulating layer disposed on the floating gate; and a control gate disposed on the interlayer insulating layer;

source/drain junctions disposed in the semiconductor substrate between adjacent ones of the plurality of gate stacks, wherein the source/drain junctions each comprise a first edge portion that overlaps an edge of the one of the plurality of gate stacks and a second edge portion on a side opposite the first edge portion, wherein the second edge portion does not overlap the one of the plurality of gate stacks or an adjacent one of the plurality of gate stacks spaced apart from the opposite edge of the gate stacks and the second edge portion overlaps the portion of the semiconductor substrate in which no gate stack structures are disposed; and a channel formed between the source/drain junctions.

6. The non-volatile memory device of claim 1 further comprising a low resistance layer disposed on the control gate to reduce resistance of the control gate.

7. The non-volatile memory device of claim 5 further comprising a low resistance layer disposed on the control gate to reduce resistance of the control gate.

8. The non-volatile memory device of claim 5, wherein the source/drain junctions are disposed approximately 20 nm to approximately 45 nm from the edge of the one of the plurality of gate stacks.

* * * * *